United States Patent [19]

Anderson et al.

[11] Patent Number: 5,199,079
[45] Date of Patent: Mar. 30, 1993

[54] SUPPLY VOLTAGE RESPONSIVE AUDIBLE TRANSIENT (POP) SUPPRESSION ARRANGEMENT

[75] Inventors: Mark R. Anderson, Indianapolis; John A. Andrews, Greenwood, both of Ind.

[73] Assignee: Thomson Consumer Electronics, Inc., Indianapolis, Ind.

[21] Appl. No.: 703,107

[22] Filed: May 21, 1991

[51] Int. Cl.$^5$ .......................................... H04B 15/00
[52] U.S. Cl. .................................... 381/94; 381/120; 381/28; 330/297; 330/51
[58] Field of Search ........................ 381/94, 120, 28; 330/297, 202, 51; 318/165, 190

[56] References Cited

U.S. PATENT DOCUMENTS

| | | | |
|---|---|---|---|
| 3,889,202 | 6/1975 | Suzuki | 330/51 |
| 3,920,931 | 11/1975 | Yanick, Jr. | 381/109 |
| 3,992,677 | 11/1976 | Tsurushima | 330/51 |
| 4,315,221 | 2/1982 | Numata et al. | 330/51 |
| 4,405,948 | 9/1983 | Griffis | 358/198 |
| 4,600,947 | 7/1986 | Chamberlain et al. | 358/165 |
| 4,788,508 | 11/1988 | Kawai | 330/51 |

OTHER PUBLICATIONS

RCA/GE Color Television Basic Service Data CTC 169(DV), published by Thomson Consumer Electronics, Inc., Indianapolis, Indiana in 1990, p. 2-G=1.

*Primary Examiner*—Jin F. Ng
*Assistant Examiner*—Nina Tong
*Attorney, Agent, or Firm*—Joseph S. Tripoli; Peter M. Emanuel

[57] ABSTRACT

An audio signal processing channel includes a bias network for deriving a bias voltage which is coupled to a point within the channel from the supply voltage. In order to inhibit audible transients or "pops" due to the rapid reduction of the bias voltage when the voltage supply is deenergized, a diode is coupled between the bias network and the voltage supply so as to selectively decouple a filter capacitor of the bias network from the voltage supply and associated loads when the voltage supply is deenergized. As a result, the bias voltage is gradually reduced at a controlled rate of change which is independent of the impedances of voltage supply and associated loads. Such a "pop" suppression arrangement is particularly desirable when it is not possible or practical to "mute" the output amplifier of the channel.

16 Claims, 2 Drawing Sheets

SUPPLY VOLTAGE RESPONSIVE AUDIBLE TRANSIENT (POP) SUPPRESSION ARRANGEMENT

FIELD OF THE INVENTION

The invention concerns an arrangement for suppressing audible transients, sometimes referred to as "pops", which may occur when a voltage supply for an audio signal processing channel is deenergized.

BACKGROUND OF THE INVENTION

When audio or video equipment is turned on or off, an audible transient, sometimes referred to as a "pop", may be produced as a voltage supply for an audio signal processing channel is energized or deenergized, respectively. To avoid such "pops", circuitry may be provided for muting the output amplifier of the audio channel in response to a muting control signal shortly before the equipment is turned on and off. However, it may not always be possible, practical or economical provide circuitry for muting the output amplifier.

SUMMARY OF THE INVENTION

An aspect of the invention resides in the recognition that a "pop" may be produced due to sudden changes of a bias voltage coupled to a point within an audio signal processing channel when the equipment in which the audio signal processing channel is included is turned off and the supply voltage from which the bias voltage is derived is suddenly reduced. Another aspect of the invention concerns an arrangement for suppressing such "pops" by providing a switching device for selectively decoupling a voltage storage element, such as a capacitor, which stores the bias voltage from the supply voltage source when the equipment is turned off. As a result, the bias voltage is gradually reduced at a controlled rate of change which is not dependent on the impedance of the supply voltage source or other loads coupled to the supply voltage source. Such an arrangement for suppressing "pops" is particularly desirable for use in audio signal processing channels in which the output amplifier is not "muted".

These and other aspects of the invention will be explained with reference to a preferred embodiment of the invention shown in the accompanying Drawing.

Figure 1:
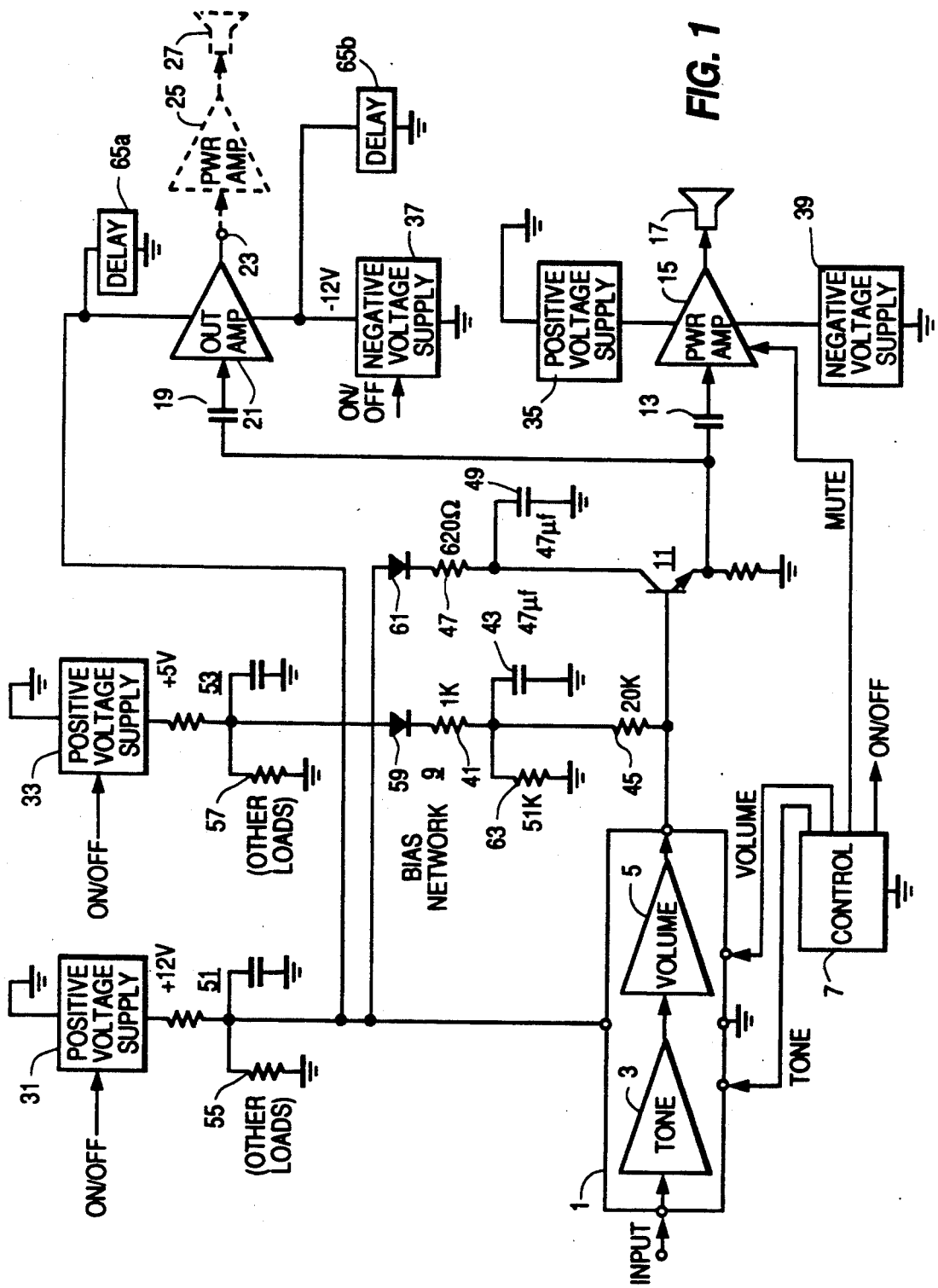
FIG. 1 is a schematic diagram of an audio signal processing channel including a "pop" suppression arrangement constructed in accordance with the invention.

Various component values are indicated in the Figures by way of example.

DETAILED DESCRIPTION OF THE DRAWING

The audio signal processing channel shown in the FIG. 1 is one of the left and right audio signal processing channels comprising a stereophonic sound system which may, for example, be incorporated in a television receiver. The other channel is identical and therefore has not been shown.

The audio signal (for example, the "left" audio signal) to be processed is coupled to the input of an integrated circuit (IC) 1 which includes a first amplifier 3 for controlling the bass and treble (tone) characteristics of the audio signal and a second amplifier 5 for controlling the volume characteristic of the audio signal. IC 1 receives DC tone and volume control signals from a control unit 7. By way of example, IC 1 may be a TA7630 audio signal processing IC available from Toshiba Corporation. This TA7630 IC has provisions for controlling the bass, treble and volume functions of left and right audio signals as well as the balance between them.

The output of IC 1 is coupled to a bias network 9 and to the base of an emitter-follower configured NPN transistor 11, the function of which will be explained below in greater detail. The emitter of transistor 11 is coupled through a coupling capacitor 13 to the input of an audio power amplifier 15. The output of amplifier 15 is coupled to a loudspeaker 17. The emitter of transistor 11 is also coupled through a coupling capacitor 19 to the input of an output amplifier 21. The output of amplifier 21 is coupled to terminal 23 to which an external power amplifier 25 and associated loudspeaker 27 may be connected, as is indicated by the phantom lines. The provisions for connecting an external power amplifier and external loudspeaker are desirable since they permit a user the option connecting external high fidelity ("hi-fi") audio equipment with more power and/or other superior performance characteristics compared with those of internal counterparts. Internal power amplifier 15 is deactivated in the manner to be described below when external power amplifier 25 and associated loudspeaker 27 are to be utilized. Although not shown, another output amplifier similar to output amplifier 21 may be provided for headphones.

The audio signal processing channel receives positive supply voltages from positive voltage supplies 31, 33 and 35 and negative supply voltages from negative supply voltages from negative voltage supplies 37 and 39. Voltage supplies 31, 33 and 37, which provide supply voltages for IC 1, bias network 9 and output amplifier 21, are energized when the television receiver is "on" and deenergized when the receive is "off" in response to an "on/off" control signal generated by control unit 7. However, voltage supplies 35 and 39, which provide supply voltages for power amplifier 15, remain energized even the television receiver is "off" in order avoid the need for a relatively high power switching arrangement. Power amplifier 15 (which remains energized) is "muted" in response to a "mute" control signal generated by control unit 7 to inhibit audible noise when the television receiver is "off". While "muted" power amplifier 15 is placed in a relatively low power consumption mode of operation during which it is essentially deactivated. The "mute" control signal is also used to deactivate power amplifier 15 and thereby decouple loudspeaker 17 from the audio channel when external power amplifer 25 and associated loudspeaker 27 are utilized. Power amplifier 15 may comprise a μPC1188H available from NEC Corp. of Japan. This IC has "muting" provisions of the type described. An arrangement similar to the present one, in which the audio power amplifier remains energized even when the television receiver is "off", is described in greater detail in U.S. patent application Ser. No. 511,295, entitled "Apparatus for the Muting of an Audio Power Amplifier in a Standby Mode", filed in the name of R. E. Morris, Jr. on Apr. 25, 1990, which was allowed on Dec. 10, 1990 and which is assigned to the same assignee.

As earlier noted audible transients or "pops" may be produced in response to electrical transients which may result when voltage supplies such as voltage supplies 31 and 33 are energized and deenergized. To inhibit such audible transients ("pops"), the "mute" control signal is generated and coupled to power amplifier 15 shortly before the receiver is turned on in response to a user initiated "on" command and shortly before and while the receiver is turned off in response to a user initiated "off" command. Unfortunately, an output amplifier such as output amplifier 21 provided for external power amplifier 25 and loudspeaker 27 or a similar output amplifier for headphones may not have "muting" provisions. "Muting" circuitry may not be incorporated within an IC, such as the LF347N IC available from National Semiconductor Corporation, comprising the amplifier, and external muting circuitry may be expensive. As a result, "pops" may be produced when the receiver is turned on and off even though output amplifier 21 is energized and deenergized, respectively, at approximately the same time, as will now be explained.

It is desirable to minimize the number of non-zero bias voltages coupled to the audio signal processing channel to reduce the possibility of "pops" due to bias voltage transitions. Accordingly, output amplifier 21 and other portions of the audio signal processing channel which are not shown have balanced configurations and receive both positive and negative supply voltages so that substantially zero-volt bias or quiescent conditions exist at their inputs and outputs. However, it may not be possible or practical to configure all portions of the audio signal processing channel to have such desired zero-volt bias conditions. Specifically, the TA7630 audio signal processing IC suitable for use as IC 1 may be operated with equal magnitude positive and negative supply voltage applied to its supply voltage input terminals (+ and −). Under those conditions, the bias voltage required at its output would be zero. However, it would also require the DC control voltages for bass, treble, volume and balance to be adjustable between negative and positive levels. This is undesirable since it requires control circuitry which is more complex and expensive than control circuitry which needs to generate a control voltage with only a single polarity. As a result, IC 1 is operated with the positive supply voltage provided by voltage supply 31 coupled to one supply voltage input terminal (+) and ground connected to its other supply voltage input terminal (−). Under these conditions, bias network 9 is required to supply a positive bias voltage to the output of volume control amplifier 5 of IC 1.

Bias network 9 derives the bias voltage for the output of volume control amplifier 5 of IC 1 from the positive supply voltage provided by voltage supply 33. The bias voltage is developed at the junction of a resistor 41 and a capacitor 43 comprising a low pass filter, and is coupled through a resistor 45 to the output of IC 1. Although not shown, another resistor, corresponding to resistor 45, is coupled between the junction of resistor 41 and capacitor 43 and the output of IC 1 utilized for the other audio channel. In the embodiment shown in FIG. 1, the output impedance of IC 1 is relatively high as is the input impedance presented at the base of transistor 11. As a result, the bias voltage is nearly the same as the supply voltage provided by voltage supply 33.

Since volume control amplifier 5 has a relatively high output impedance, emitter-follower configured NPN transistor 11 is provided as a low output impedance buffer between the output of volume control amplifier 5 and the inputs amplifiers 15 and 21. The operating voltage for emitter-follower configured transistor 11 is derived from the positive supply voltage provided by voltage supply 31 and is coupled to the collector of transistor 11 through a low pass filter comprising a resistor 47 and a capacitor 49.

Without the arrangement according to the invention for inhibiting rapid transistions to be described below, a rapid negative-going transition will be developed at the emitter of transistor 11 when voltage supplies 31 and 33 are deenergized due to the rapid reduction of the respective supply voltages. Low pass filter circuits 51 and 53 associated with voltage supplies 31 and 33 contain capacitors which tend to slow the reduction of the supply voltages somewhat. The supply voltages are nevertheless reduced relatively rapidly due to the impedance paths to ground (represented by resistors 55 and 57) presented by the various loads of voltage supplies 31 and 33. The time at which the "pop" causing transition occurs depends on which one of the supply voltages provided by voltage supplies 31 and 33 is more rapidly reduced. The resulting transient may be coupled to loudspeaker 27 because output amplifier 21 remains sufficiently energized to have a significant gain when the transition occurs due to voltage storage elements associated with its supply voltage inputs. The problem is made worse because of the relatively high nominal gain (for example, in the order of 10 db) of output amplifier 21 and the relatively high gain of external power amplifier 25.

To inhibit the rapid reduction of the bias voltage provided by bias network 9, and therefor a corresponding "pop", a diode 59 is coupled between filter capacitor 43 and voltage supply 33 to selectively decouple voltage supply 33 and its associated loads 57 from capacitor 43 when voltage supply 33 is deenergized. Diode 57 is conductive as long as voltage supply 33 is energized. When voltage supply 31 is deenergized, the supply voltage produced at its output is rapidly reduced due to loads 57. However, the voltage stored by relatively large capacitor 43 cannot change as rapidly causing diode 59 to be rendered non-conductive. As a result, capacitor 43 is decoupled from load 57. Thereafter, capacitor 43 is gradually discharged and the bias voltage is correspondingly gradually reduced at a controlled rate of change which is not dependent on the impedance of supply voltage source 31 or loads 57 coupled to it. In similar fashion, a diode 61 is coupled between filter capacitor 49 and voltage supply 33 to selectively decouple voltage supply 31 and its associated loads 55 from capacitor 49 when voltage supply 31 is deenergized in order to inhibit the rapid reduction of the operating voltage for emitter-follower configured transistor 11.

It has been found that the bias voltage developed at the output of IC 1 has a tendency to change with changes of the DC volume and balance controls due to the presence of diode 59. Such changes are undesirable since they may affect the bias of emitter-follower configured NPN transistor 11 to the point at which audio signals are "clipped". It is believed that the bias shifts occur because the impedances presented by voltage supply 33 and associated loads 57 which would, without the presence of diode 59, tend to prevent the voltage developed across filter capacitor 43 from changing with changes of the DC control voltages are decoupled by diode 59 as the magnitude of the DC voltage developed at the output of IC 1 approaches the magnitude of the supply voltage provided by voltage supply 33. To minimize such changes of the bias voltage, a resistor 63 is connected in shunt with capacitor 43. Resistor 63 serves as a "bleeder" resistor for the voltage developed across capacitor 43.

As earlier indicated, "pop" causing transients may also be produced in response to rapid transitions of the bias voltage coupled to the output of IC 1 and the operating voltage for transistor 11 when voltage supplies 31 and 33 are energized. Voltage supply decoupling diodes 59 and 61 are not effective for inhibiting such transients since they are rendered conductive when voltage supplies 31 and 33 are energized because the voltages at their respective cathodes are initially held at zero volts by filter capacitors 43 and 49. During the "turn-on" period, resistors 41 and 47 limit the currents through diodes 59 and 61, respectively. Without resistor 41 and 47, the currents through diodes 59 and 61 could be significant because the initial voltages developed across capacitors 43 and 49 are equal to zero.

While resistor 41 and capacitor 43 and resistor 47 and capacitor 49 tend to reduce the rate of change of the transitions, this reduction is not sufficient to eliminate the "pops". To suppress such turn-on "pops", capacitive delay circuits 65a and 65b are coupled to the positive and negative voltage supply inputs of output amplifier 21 to delay the energization of output amplifier 21 until after the transients have occurred. As a result, turn-on transients do not reach loudspeaker 17. Delay circuits 65a and 65b also help to inhibit "pops" by causing the positive and negative supply voltages of output amplifier 21 to be applied substantially at the same time thereby ensuring that zero-volt bias conditions are established during the "turn-on" or energization period.

Figure 2:
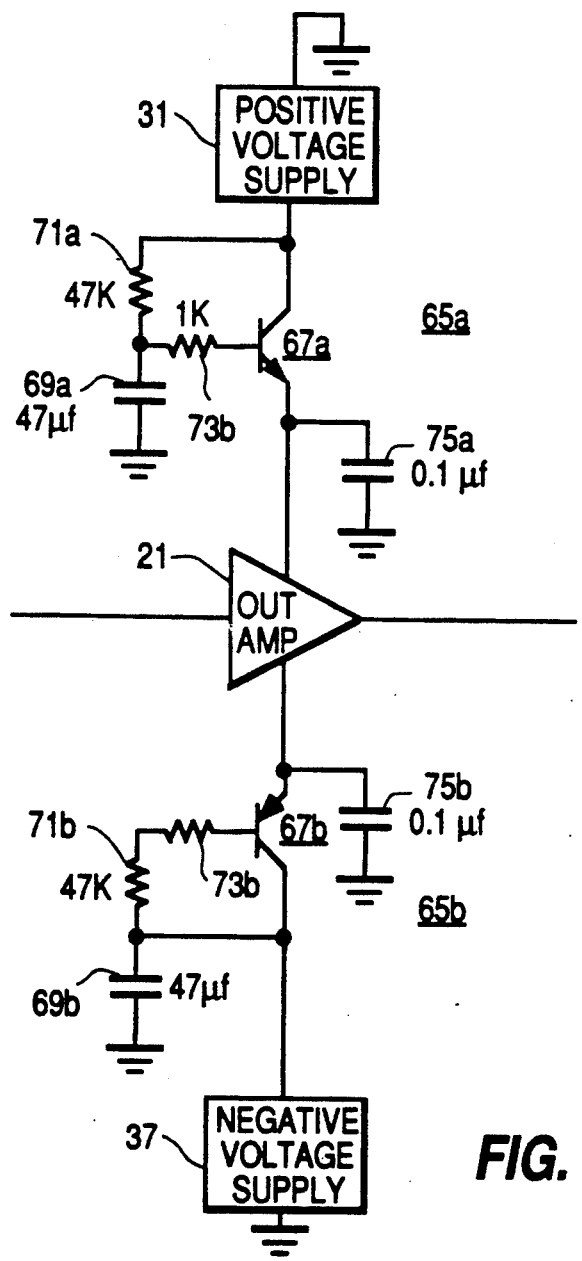
FIG. 2 is a schematic diagram of an implementation of a portion of the audio signal processing channel shown in FIG. 1.

Implementations of delay circuits 65a and 65b are shown in FIG. 2. The implementations are similar and therefore corresponding components of each are identified by the similar reference designations, differing only by the letters "a" and "b". Since the implementations are similar, only delay circuit 65a will be described in detail. Delay circuit 65a includes a NPN transistor 67a having it collector connected to positive voltage supply 31 and its emitter connected to the positive voltage supply input terminal of output amplifier 21. One terminal of a capacitor 69a is coupled through a resistor 71a to positive voltage supply 31. The other terminal of capacitor 69a is connected to ground. The base of transistor 67a is coupled to the junction of capacitor 69a and resistor 71a through a resistor 73a. A filter capacitor 75a is connected in shunt with the positive supply voltage input of output amplifier 21. When positive voltage supply 31 is energized, NPN transistor 67a is non-conductive and remains non-conductive until capacitor 69a is charged to a sufficiently positive voltage to forward bias the base-emitter junction of transistor 67a. As a result, positive voltage supply and its loads 55 are decoupled from output amplifier for a time delay determined by capacitor 69a and resistor 71a. Basically, delay circuit 65b differs from delay circuit 65a in that it utilizes a PNP transistor 67b rather than a NPN transistor because of the different polarities involved.

While delay circuits 65a and 65b inhibit turn-on "pops" in the manner described above, they also tend to delay the deenergization of output amplifier 21. This may increase the possibility of "pops" due to the rapid reduction of the bias voltage for the output of IC 1 and the operating voltage for transistor 11 during the "turn-off" or deenergization period. Voltage supply decoupling diodes 59 and 61 are particularly desirable for that reason.

While the invention has been described in relation to a positive voltage supply, it will be appreciated it is also applicable to a negative voltage supply, and also to both positive and negative voltage supplies. Further, while the invention has been described in terms of an embodiment in which a bias network for an IC is external to the IC, the bias network may be internal to the IC. In that case, the voltage supply diode would be coupled between the voltage supply and the supply voltage input of the IC. In addition, while the diodes are utilized in the described embodiment because of their relative simplicity, it will be appreciated that other types of voltage supply decoupling devices, such a transistor, may also be utilized. Still further, while the described "pop" suppression arrangement is particularly desirable when it is not possible or practical to "mute" the output of the audio channel, it may also be utilized in audio signal processing channels in which the output is "muted" depending on the particular characteristics of the "muting" circuitry. These and other modifications are intended to be within the scope of the invention defined by the following Claims.

We claim:

1. In an audio channel for processing an audio signal, apparatus comprising:
   means for amplifying said audio signal;
   means for selectively providing a supply voltage;
   means for storing a voltage related to said supply voltage;
   means for coupling said stored voltage to said audio signal amplifying means as an operating voltage; and
   means for selectively coupling said supply voltage providing means to said voltage storing means when said supply voltage is provided and selectively decoupling said supply voltage providing means from said voltage storing means when said supply voltage is removed so that said operating voltage for said audio signal amplifying means is temporarily maintained by said storing means after said supply voltage is initially removed.

2. The apparatus recited in claim 1, wherein:
   said selectively coupling and decoupling means comprises a switching device responsive to said supply voltage for selectively coupling said supply voltage providing means to said voltage storing means when the magnitude of said supply voltage exceeds a given level and for selectively decoupling said supply voltage providing means from said voltage storing means when the magnitude of said supply voltage does not exceed said given level.

3. The apparatus recited in claim 2, wherein:
   said switching means comprises a unidirectional conduction device.

4. The apparatus recited in claim 3, wherein:
   said voltage storing means comprises a capacitor.

5. The apparatus recited in claim 2, wherein:
   said operating voltage is a bias voltage for said audio signal amplifying means.

6. The apparatus recited in claim 5, wherein:
   said voltage storing means stores said bias voltage.

7. In an audio channel for processing an audio signal, apparatus comprising:
means for amplifying said audio signal:
means for selectively providing a supply voltage;
means for deriving a non-zero bias voltage from said supply voltage and for coupling said bias voltage to said audio signal amplifying means;
means for storing a voltage coupled to said bias voltage deriving means; and
means for selectively coupling said supply voltage providing means to said bias voltage deriving means and said voltage storing means when said supply voltage is provided and selectively decoupling said supply voltage providing means from said bias voltage deriving means and said voltage storing means when said supply voltage is removed so that said bias voltage for said audio signal amplifying means is temporarily maintained by said storing means after said supply voltage is initially removed.

8. The apparatus recited in claim 7, wherein:
said selectively coupling and decoupling means comprises a switching device responsive to said supply voltage for selectively coupling said supply voltage providing means to said bias voltage deriving means and said voltage storing means means when the magnitude of said supply voltage exceeds a given level and for selectively decoupling said supply voltage providing means from said bias voltage deriving means and said voltage storing means when the magnitude of said supply voltage does not exceed said given level.

9. The apparatus recited in claim 8, wherein:
said switching means comprises a unidirectional conduction device.

10. The apparatus recited in claim 9, wherein:
said voltage storing means comprises a capacitor for storing said bias voltage.

11. The apparatus recited in claim 7, wherein:
said bias voltage deriving means is coupled to an output of said amplifying means.

12. The apparatus recited in claim 11, wherein:
said amplifying means is responsive to a gain control signal for controlling the amplitude of said amplified version of said audio signal.

13. The apparatus recited in claim 11, wherein:
said selectively coupling and decoupling means comprises a switching device responsive to said supply voltage for selectively coupling said supply voltage providing means to said bias voltage deriving means and said voltage storing means means when the magnitude of said supply voltage exceeds a given level and for selectively decoupling said supply voltage providing means from said bias voltage deriving means and said voltage storing means when the magnitude of said supply voltage does not exceed said given level.

14. The apparatus recited in claim 13, wherein:
said switching means comprises a unidirectional conduction device.

15. The apparatus recited in claim 14, wherein:
said voltage storing means comprises a capacitor for storing said bias voltage;
the magnitude of said bias voltage stored by said capacitor has a tendency to change in response to changes of the magnitude of said gain control signal: and further including
an impedance element coupled to said capacitor for inhibiting said changes of said magnitude of said bias voltage stored by said capacitor.

16. Audio processing apparatus comprising:
a first amplifier having an input to which an audio signal is coupled an an output:
first source means for selectively providing a first supply voltage when activated;
means for deriving a bias voltage for said first amplifier from said first supply voltage;
first storage means for storing said bias voltage;
first decoupling means for selectively decoupling said first storage means from said first source means when said first source means is deactivated;
a second amplifier having an input and an output, said output of said first amplifier being coupled to said input of said second amplifier;
means for coupling the output of said second amplifier to a loudspeaker;
second source means for selectively providing a second supply voltage for said second amplifier when activated;
second storage means for storing said second supply voltage; and
second decoupling means for selectively decoupling said second storage means from said second source means when said second source means is deactivated.

* * * * *